United States Patent
Murai et al.

(10) Patent No.: US 7,759,583 B2
(45) Date of Patent: *Jul. 20, 2010

(54) CIRCUIT BOARD

(75) Inventors: Makoto Murai, Isehara (JP); Ryosuke Usui, Ichinomiya (JP)

(73) Assignee: Sanyo Electric Co., Ltd., Osaka (JP)

( * ) Notice: Subject to any disclaimer, the term of this patent is extended or adjusted under 35 U.S.C. 154(b) by 235 days.

This patent is subject to a terminal disclaimer.

(21) Appl. No.: 11/528,683

(22) Filed: Sep. 28, 2006

(65) Prior Publication Data

US 2007/0082183 A1 Apr. 12, 2007

(30) Foreign Application Priority Data

Sep. 30, 2005 (JP) .............................. 2005-286298

(51) Int. Cl.
*H05K 1/11* (2006.01)
(52) U.S. Cl. .................. 174/266; 174/258; 428/209; 428/210
(58) Field of Classification Search .......... 428/209, 428/210; 174/266, 258
See application file for complete search history.

(56) References Cited

U.S. PATENT DOCUMENTS

| | | | | |
|---|---|---|---|---|
| 4,134,848 A * | 1/1979 | Adicoff et al. | ............... | 523/219 |
| 4,335,180 A * | 6/1982 | Traut | ....................... | 428/301.1 |
| 5,055,342 A * | 10/1991 | Markovich et al. | .......... | 428/137 |
| 5,144,536 A * | 9/1992 | Tsukada et al. | ............. | 361/765 |
| 5,316,803 A * | 5/1994 | White et al. | ................ | 427/554 |
| 5,607,744 A * | 3/1997 | Diener et al. | ................ | 428/131 |
| 5,972,482 A * | 10/1999 | Hatakeyama et al. | ....... | 428/209 |
| 6,038,133 A * | 3/2000 | Nakatani et al. | ............ | 361/760 |
| 6,459,047 B1 * | 10/2002 | Japp et al. | .................... | 174/256 |
| 6,528,145 B1 * | 3/2003 | Berger et al. | ................ | 428/156 |
| 6,896,953 B2 * | 5/2005 | Taga et al. | .................. | 428/210 |
| 7,315,083 B2 * | 1/2008 | Igarashi et al. | .............. | 257/758 |

FOREIGN PATENT DOCUMENTS

JP 05-167212 7/1993

(Continued)

OTHER PUBLICATIONS

Japanese Office Action, with English translation, issued in Japanese Patent Application No. 2005-286298, mailed Apr. 28, 2009.

(Continued)

*Primary Examiner*—Cathy Lam
(74) *Attorney, Agent, or Firm*—McDermott Will & Emery LLP

(57) ABSTRACT

A circuit board, having improved adhesion between its via conductor and insulating layer, is provided. The circuit board includes a first wiring layer, a second wiring layer, the insulating layer, a filler, and the via conductor. The first wiring layer and the second wiring layer are electrically insulated from each other by the insulating layer. The filler which has a favorable thermal conductivity is added into the insulating layer. The via conductor establishing electrical connection between the first wiring layer and the second wiring layer is formed in a predetermined position of the insulating layer. The via conductor is in direct contact with part of the filler added into the insulating layer.

6 Claims, 3 Drawing Sheets

FOREIGN PATENT DOCUMENTS

| | | |
|---|---|---|
| JP | 05-235544 | 9/1993 |
| JP | 09-312479 | 12/1997 |
| JP | 2001-223450 | 8/2001 |
| JP | 2004-288795 | 10/2004 |

OTHER PUBLICATIONS

Japanese Decision of Refusal, English translation thereof, issued in Japanese Patent Application No. JP 2005-286298 dated Dec. 8, 2009.

* cited by examiner

CIRCUIT BOARD

BACKGROUND OF THE INVENTION

1. Field of the Invention

The invention relates to a circuit board on which electronic components can be mounted. In particular, the invention relates to a circuit board having wiring layers that are electrically connected to each other by via conductors.

2. Description of the Related Art

As circuit apparatuses grow in density, circuit boards for mounting electronic components, such as semiconductor devices, have been formed in multiple layers. In general, the wiring layers of a circuit board are electrically insulated from each other by an insulating layer, and are electrically connected to each other by via conductors which pierce through the insulating layer in predetermined positions.

Japanese Patent Laid-Open Publication No. 2004-288795 (hereinafter, referred to as Patent Document 1) discloses a typical example of these conventional circuit boards. The circuit board described in Patent Document 1 has a resin layer that is provided with a glass cloth to ensure strength. Part of the glass cloth protrudes from the inner walls of via holes, thereby establishing an anchoring structure with a plating layer formed in the via holes.

With these conventional circuit boards, the adhesion between the via conductors formed in the via holes and the insulating layer has been inadequate. For example, in the foregoing Patent Document 1, the glass cloth protruding from the sidewalls of the via holes occupies only a limited area in relation to the sidewalls of the via holes, and therefore fails to provide a sufficient anchoring effect.

SUMMARY OF THE INVENTION

The present invention has been developed in view of the foregoing problems. It is thus an object of the present invention to provide a circuit board having a via conductor and an insulating layer that have improved adhesion therebetween.

One of the aspects of the present invention is a circuit board. This circuit board includes: a plurality of wiring layers; an insulating layer which establishes electrical insulation between the plurality of wiring layers; a heat-conductive particulate filler added into the insulating layer; and a via conductor which establishes electrical connection between the plurality of wiring layers, the via conductor being formed in a via hole piercing through the insulating layer in a predetermined position, and wherein part of the filler is exposed in a sidewall of the via hole and put in contact with the via conductor.

In the foregoing aspect, the filler may have a coefficient of thermal expansion closer to that of the via conductor than that of the insulating layer.

In the foregoing aspect, the contact area between the via conductor and part of the filler may be greater than that between the via conductor and the insulating layer.

It should be appreciated that any appropriate combinations of the foregoing elements are also intended to fall within the scope of the invention covered by a patent to be claimed by this patent application.

It is to be noted that any arbitrary combination or rearrangement of the above-described structural components and so forth are all effective as and encompassed by the present embodiments. Moreover, this summary of the invention does not necessarily describe all necessary features so that the invention may also be sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described by reference to the preferred embodiments. This does not intend to limit the scope of the present invention, but to exemplify the invention.

Hereinafter, an embodiment of the present invention will be described with reference to the drawings.

Figure 1:
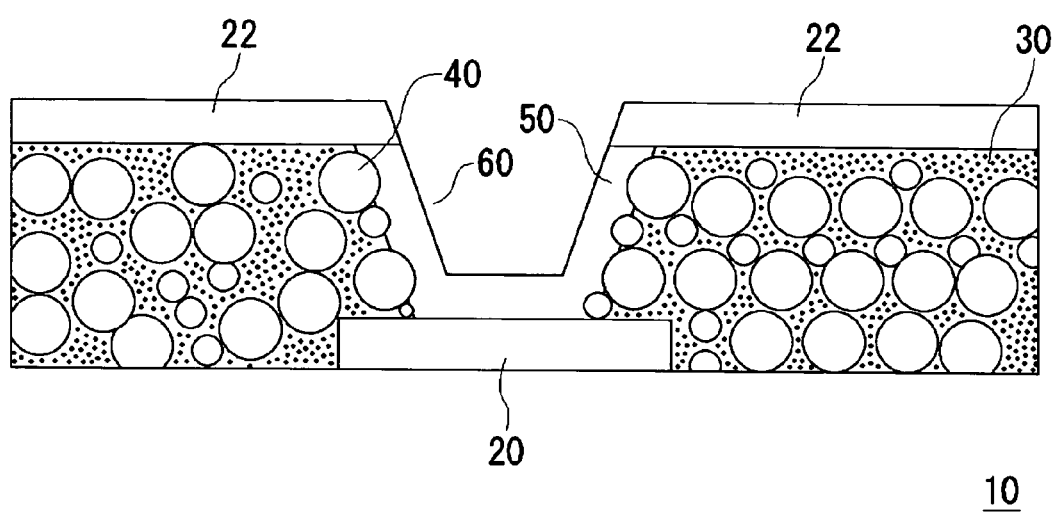
FIG. 1 is a diagram showing the configuration of a circuit board according to an embodiment.

FIG. 1 is a diagram showing the configuration of a circuit board 10 according to the embodiment. The circuit board 10 includes a first wiring layer 20, a second wiring layer 22, an insulating layer 30, a filler 40, and a via conductor 50.

The first wiring layer 20 and the second wiring layer 22 constitute part of a multilayer wiring arrangement, and have respective predetermined wiring patterns. The first wiring layer 20 and the second wiring layer 22 are not limited to any particular material, but are preferably made of metal such as copper.

The insulating layer 30 is interposed between the first wiring layer 20 and the second wiring layer 22. The insulating layer 30 establishes electrical insulation between the first wiring layer 20 and the second wiring layer 22. Materials available to form the insulating layer 30 include epoxy resins, melamine derivatives such as BT resins, liquid crystal polymers, PPE resins, polyimide resins, fluorine resins, phenol resins, and polyamide bismaleimides. The insulating layer 30 is not particularly limited in thickness, however in preferred embodiments it typically has a thickness of 35 to 120 μm. Note that the lower limit of thickness of the insulating layer 30 must be at least greater than the particle size of the filler 40, to be described next.

The filler 40 is made of a particulate inorganic material having a favorable thermal conductivity. Materials available to form the filler 40 include alumina, boron nitride, and aluminum nitride. The filler 40 in the present embodiment has a spherical shape, whereas it should be appreciated that the filler 40 may have an elliptic, amorphous, needle-like, or other shape as long as it is particulate.

The filler 40 in the insulating layer 30 preferably has a volumetric filling rate of 60 to 80 vol %, and even more preferably a volumetric filling rate of 65 to 75 vol %. If the filler 40 falls below a volumetric filling rate of 60 vol %, it can make only an insufficient contribution to the anchoring structure with the via conductor 50 in the sidewall area of a via hole 60, and fails to provide a sufficient thermal conductivity. On the other hand, if the volumetric filling rate of the filler 40 exceeds 80 vol %, the insulating layer 30 becomes fragile and durability falls. To achieve the volumetric filling rate of the filler 40 of 60 to 80 vol %, it is preferable to mix groups of particles having both relatively large and small sizes. Since the particles of smaller sizes get into gaps between the particles of larger sizes, the filler 40 can be added into the insulating layer 30 more efficiently. By way of example, when a group A having an average particle size of 0.7 μm and a group B having an average particle size of 3 μm (maximum particle size of 15 μm) are mixed to a composition ratio of 1:4, the resulting filler 40 has a volumetric filling rate of approximately 70 vol %.

The filler 40 preferably has a coefficient of thermal expansion that is closer to that of the via conductor 50 than that of the insulating layer 30. By way of further example, assume that the insulating layer 30 is made of epoxy resin (with a coefficient of thermal expansion of $30.3 \times 10^{-6}$/K) and the via conductor 50 is made of copper (with a coefficient of thermal expansion of $17.7 \times 10^{-6}$/K). In that instance, the insulating layer 30 can contain alumina (with a coefficient of thermal expansion of $7.8 \times 10^{-6}$/K) as the filler 40 in order to achieve the above-mentioned relationship.

Since the filler 40 having the coefficient of thermal expansion closer to that of the via conductor 50 than that of the insulating layer 30 is used thus, the via conductor 50 and the filler 40 cause only a small amount of thermal stress therebetween, even when the circuit board 10 temperature rises. The via conductor 50 is thus prevented from exfoliating from the insulating layer 30 and the filler 40. In other words, this configuration solves one of the problems of the conventional circuit boards, which is that: major portions of the via conductors in via holes are in contact with the resin that makes the insulating layer, and a large difference between the coefficient of thermal expansion of the via conductors and that of the resin can produce thermal stress to cause exfoliation of the wiring and the resin when the entire circuit board is exposed to high temperatures.

The via conductor 50 is formed in the via hole 60 which pierces through the insulating layer 30 in a predetermined position. In the present embodiment, the via conductor 50 is formed to cover the sidewall of the via hole 60. The filler 40 added into the insulating layer 30 is exposed in the sidewall of the via hole 60. Consequently, the via conductor 50 makes direct contact with part of the filler 40. The contact area between the via conductor 50 and the filler 40 is desirably greater than that between the via conductor 50 and the insulating layer 30. It should be appreciated that while the via conductor 50 and the second wiring layer 22 in the present embodiment are separate members, the two may also be seamless. In such an instance, part of the second wiring layer 22, formed inside the via hole 60, corresponds to the via conductor 50.

Since the filler 40 is exposed in the sidewall of the via hole 60, pits and projections are formed on the sidewall of the via hole 60 depending on the distribution of the filler 40. These pits and projections increase the contact area of the via conductor 50 with the insulating layer 30 and the filler 40, thereby enhancing the anchoring effect. This consequently provides improved adhesion of the via conductor 50 to the insulating layer 30 and the filler 40. It should therefore be appreciated that in order to enhance the anchoring effect further, the insulating layer 30 is preferably eliminated from between adjoining particles of the filler 40 as much as possible unless it precludes the fixing of the filler 40.

Note that in the conventional circuit boards, major portions of the via conductors in the via holes are in contact with the resin that makes up the insulating layer. There has thus been the problem that a large difference between the coefficient of thermal expansion of the via conductors and that of the resin can produce a thermal stress to cause exfoliation of the wiring and the resin when the entire circuit board is exposed to high temperatures.

In the circuit board 10 according to the embodiment, on the other hand, the filler 40 has a coefficient of thermal expansion closer to that of the via conductor 50 than that of the insulating layer 30. The via conductor 50 and the filler 40 therefore cause only a small amount of thermal stress even when the circuit board 10 temperature rises. This suppresses the exfoliation of the via conductor 50 from the insulating layer 30 and the filler 40.

The above effects of improved adhesion of the via conductor 50 to the insulating layer 30 and the filler 40 and suppressed exfoliation can be ensured and enhanced when the contact area between the via conductor 50 and the filler 40 is greater than that between the via conductor 50 and the insulating layer 30.

The circuit board 10 of the present embodiment also has improved heat radiation capability at higher temperatures. By way of example, alumina, or the filler 40, has a thermal conductivity of around 30 W/mK, which is 100 times greater than that of epoxy resin or the insulating layer 30. Consequently, since the via conductor 50 is in direct contact with the filler 40 which has the favorable thermal conductive property, the heat diffusivity of the via conductor increases with the improvement of the heat radiation capability of the circuit board.

The filler 40 has a moisture absorbency level lower than that of the insulating layer 30. The exposure of the filler 40 in the sidewall of the via hole 60 thus makes the moisture absorption of the insulating layer 30 decrease slightly during wet processes used during manufacture of the circuit board. This prevents the circuit board 10 from swelling and deforming.

(Manufacturing Method)

FIGS. 2A to 3C show a method of manufacturing the circuit board 10 in accordance with the present embodiment.

Figure 2A:
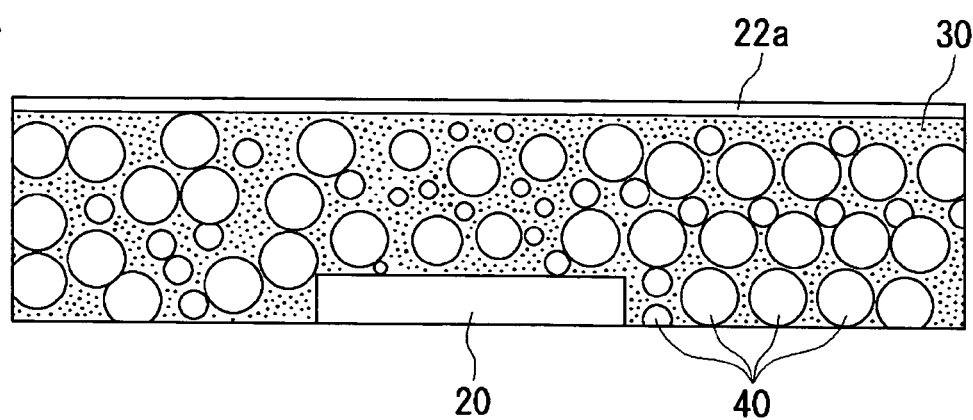
FIGS. 2A and 2B are sectional views showing the steps of a method of manufacturing the circuit board according to the embodiment.

Initially, as shown in FIG. 2A, a laminate member composed of a first wiring layer 20, a copper foil 22a, an insulating layer 30, and a filler 40 is formed. The first wiring layer 20 can be formed in a predetermined wiring pattern, for example, by a process using photolithography and etching techniques in combination. The insulating layer 30, with the filler 40 added in advance, is laminated with the copper foil 22a, and this laminate sheet is bonded onto the first wiring layer 20 to form the laminate member shown in FIG. 2A.

Figure 2B:
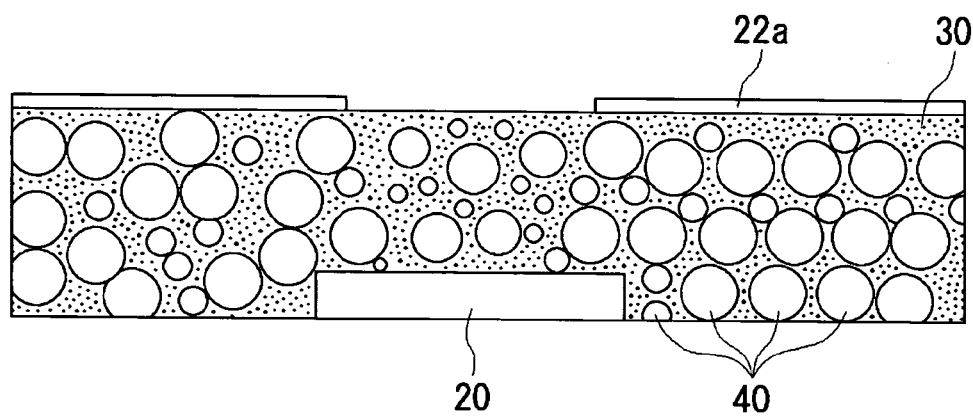

Next, as shown in FIG. 2B, the copper foil 22a is selectively removed from the position above the area where a via hole is to be formed, using photolithography and etching techniques.

Figure 3A:
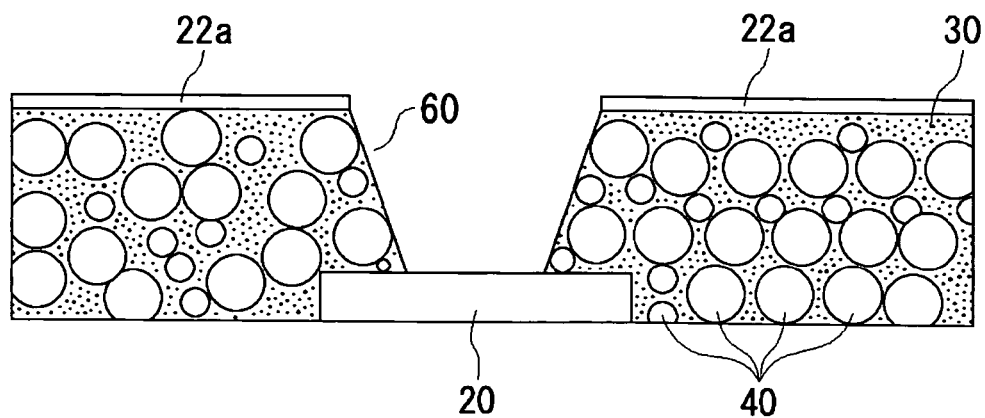
FIGS. 3A, 3B and 3C are sectional views showing the steps of the method of manufacturing the circuit board according to the embodiment.

Next, as shown in FIG. 3A, a predetermined location of the insulating layer 30 is perforated to form a via hole 60. More specifically, the predetermined location of the insulating layer 30 is irradiated with a UV laser (at a wavelength of 355 nm, and pulse width of 15 nsec) to make the via hole 60 with a diameter of approximately 70 μm. The laser used for the UV laser irradiation is preferably adjusted in pulse energy and in energy density so that the resin material of the insulating layer 30 is processed but the filler 40 is hardly affected at all. After the process, as shown in FIG. 3A, the filler 40 added into the insulating layer 30 is partially exposed in the sidewall of the via hole 60.

Figure 3B:
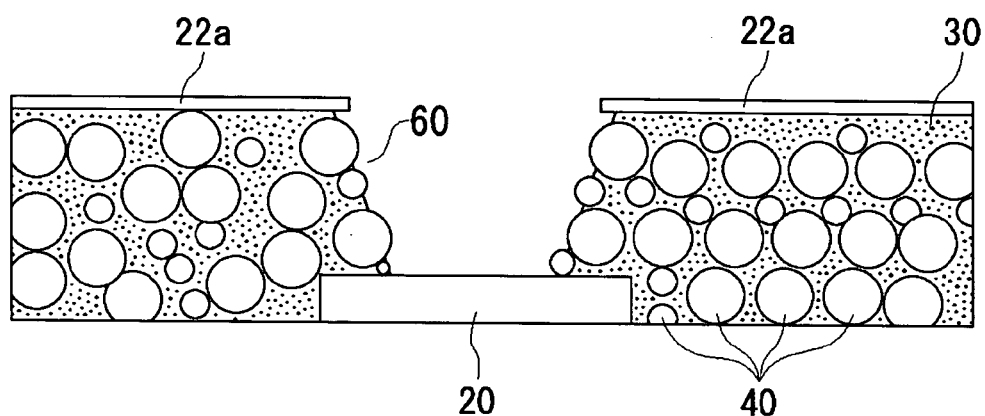
Figure 3C:
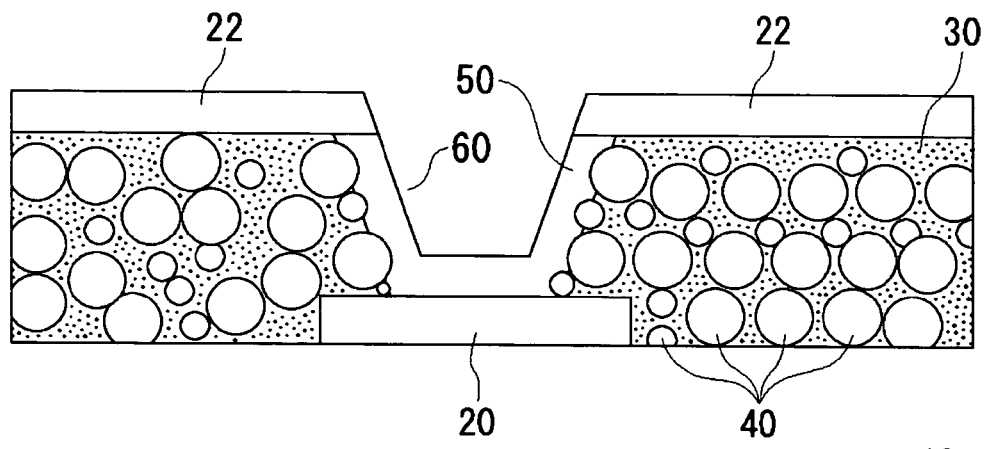

Next, as shown in FIG. 3B, the insulating layer 30 is removed from the sidewall area of the processed via hole 60. More specifically, a desmearing treatment is performed using a permanganic acid solution. This treatment eliminates resin residues produced in the UV-laser perforation process, and also eliminates any resin lying on the surface of the sidewall of the via hole 60. It should be noted that the filler 40 added into the insulating layer 30 to provide enhanced heat radiation capability, such as alumina, silica, boron nitride, and aluminum nitride, will not be etched by the permanganic acid solution. As a result, the insulating layer 30 on the sidewall of the via hole 60 shrinks as shown in FIG. 3B, so that the filler 40 added into the insulating layer 30 is exposed in the sidewall of the via hole 60.

Next, a thin copper film having a thickness of several hundred nanometers is deposited on the surface of the sidewall of the via hole 60 by electroless copper plating using palladium as a catalyst. If the filler 40 added into the insulating layer 30 is made of alumina particles having a maximum particle size of 15 μm, the pits and projections formed on the sidewall of the via hole 60 reach a maximum radius of curvature of 15 μm. These pits and projections do not interfere with the deposition of the electroless plating, however, and the sidewall of the via hole 60 can be plated uniformly and satisfactorily. Next, the via conductor 50 is formed by electrolytic copper plating using a copper sulfate solution as the plating solution (see FIG. 3C). When the plating was conducted with a current density of 20 mA/cm$^2$, a uniform plating film was formed irrespective of the pits and protrusions on the sidewall of the via hole 60. The electrolytic copper plating deposits copper on the copper foil 22a, whereby the copper foil 22a is grown to a predetermined thickness. The thickened copper foil 22a is patterned using lithographic and etching techniques, whereby the second wiring layer 22 is formed.

The present invention is not limited to the foregoing embodiment, and various types of modifications including design changes may be made thereto based on the knowledge of those who skilled in the art. All such modified embodiments are also intended to fall within the scope of the present invention.

For example, the foregoing embodiment has dealt with the case where the via conductor is formed along the sidewall of the via hole. However, the present invention is not limited thereto. For example, the via hole may be filled with the via conductor. In this case, vias according to the present invention can be stacked to form stacked vias, thereby allowing build-up of the multilayer wiring.

What is claimed is:

1. A circuit board comprising:
a plurality of wiring layers;
an insulating layer which establishes electrical insulation between the plurality of wiring layers;
a heat-conductive particulate filler added into the insulating layer; and
a via conductor which covers a via hole piercing through the insulating layer in a predetermined position and establishes electrical connection between the plurality of wiring layers, the via conductor covering the via hole along a sidewall of the via hole without filling the entirety of the via hole, wherein
part of the filler is exposed in the sidewall of the via hole so as to project from the insulating layer toward the via hole and is put in contact with the via conductor, and
the thickness of the part of the filler projecting from the sidewall of the hole is smaller than the thickness of the via conductor, and a contact area between the via conductor and part of the filler is greater than that between the via conductor and the insulating layer.

2. The circuit board according to claim 1, wherein the filler has a coefficient of thermal expansion closer to that of the via conductor than that of the insulating layer.

3. The circuit board according to claim 1, wherein the filler has a volumetric filling rate of 60 to 80 vol %.

4. The circuit board according to claim 1, wherein the filler is selected from the group consisting of alumina, boron nitride, and aluminum nitride.

5. The circuit board according to claim 1, wherein the insulating layer is made of a material selected from the group consisting of an epoxy resin, a melamine derivative such as a BT resin, a liquid crystal polymer, a PPE resin, a polyimide resin, a fluorine resin, a phenol resin, and a polyamide bismaleimide.

6. The circuit board according to claim 1, wherein part of the filler projecting from the insulating layer toward the via hole creates filler projections on the surface of the insulating layer and inside the via hole, and the filler projections are in contact with the via conductor.

* * * * *